(12) United States Patent
Ostermaier et al.

(10) Patent No.: US 12,159,918 B2
(45) Date of Patent: Dec. 3, 2024

(54) GROUP III NITRIDE-BASED TRANSISTOR DEVICE

(71) Applicant: Infineon Technologies Austria AG, Villach (AT)

(72) Inventors: Clemens Ostermaier, Villach (AT); Oliver Haeberlen, St. Magdalen (AT); Gerhard Prechtl, Rosegg (AT); Manuel Stabentheiner, Villach (AT)

(73) Assignee: Infineon Technologies Austria AG, Villach (AT)

( * ) Notice: Subject to any disclaimer, the term of this patent is extended or adjusted under 35 U.S.C. 154(b) by 107 days.

(21) Appl. No.: 17/743,720

(22) Filed: May 13, 2022

(65) Prior Publication Data

US 2022/0271147 A1    Aug. 25, 2022

Related U.S. Application Data

(62) Division of application No. 16/837,506, filed on Apr. 1, 2020, now Pat. No. 11,349,012.

(30) Foreign Application Priority Data

Apr. 3, 2019   (EP) .................................... 19167106

(51) Int. Cl.
*H01L 29/778* (2006.01)
*H01L 29/20* (2006.01)
(Continued)

(52) U.S. Cl.
CPC .... *H01L 29/66462* (2013.01); *H01L 29/2003* (2013.01); *H01L 29/4236* (2013.01);
(Continued)

(58) Field of Classification Search
None
See application file for complete search history.

(56) References Cited

U.S. PATENT DOCUMENTS 10,269,947 B1    4/2019   Moens et al.
2008/0179694 A1  7/2008   Nakazawa et al.
(Continued)

FOREIGN PATENT DOCUMENTS

CN           105556678 A       5/2016

OTHER PUBLICATIONS

Uemoto, Y. "Gate Injection Transistor (GIT)—A Normally-Off AlGaN/GaN Power Transistor Using Conductivity Modulation" IEEE Trans. on Elec. Dev. vol. 54, No. 12 Dec. 2007 pp. 3393-3399 (Year: 2007).*

(Continued)

*Primary Examiner* — Grant S Withers
(74) *Attorney, Agent, or Firm* — Murphy, Bilak & Homiller, PLLC

(57) ABSTRACT

In an embodiment, a Group III nitride-based transistor device, includes a first Group III nitride barrier layer arranged on a Group III nitride channel layer, the first Group III nitride barrier layer and the Group III nitride channel layer having differing bandgaps and forming a heterojunction capable of supporting a two-dimensional charge gas. A source, a gate and a drain are on an upper surface of the first Group III nitride barrier layer. A gate recess extends from the upper surface of the first Group III nitride barrier layer into the first Group III nitride barrier layer. A p-doped Group III nitride material arranged in the gate recess has a first extension extending on the upper surface of the first Group III nitride barrier layer towards the drain. The first extension has a length $l_d$, and 0 nm$\leq l_d \leq$200 nm.

13 Claims, 8 Drawing Sheets

(51) Int. Cl.
*H01L 29/423* (2006.01)
*H01L 29/66* (2006.01)

(52) U.S. Cl.
CPC ...... *H01L 29/7781* (2013.01); *H01L 29/7786* (2013.01); *H01L 29/7787* (2013.01)

(56) References Cited

U.S. PATENT DOCUMENTS

| | | |
|---|---|---|
| 2009/0050938 A1 | 2/2009 | Miyoshi et al. |
| 2010/0330754 A1 | 12/2010 | Hebert |
| 2014/0091316 A1 | 4/2014 | Kikkawa |
| 2014/0091363 A1* | 4/2014 | Jeon .................... H01L 29/7786 257/194 |
| 2014/0225161 A1* | 8/2014 | Okita .................. H01L 29/7787 438/285 |
| 2015/0311329 A1* | 10/2015 | Nakazawa ........ H01L 29/66462 257/76 |
| 2017/0117403 A1 | 4/2017 | Okita et al. |
| 2021/0057560 A1* | 2/2021 | Cheng ................ H01L 29/1066 |
| 2021/0202728 A1 | 7/2021 | Nongaillard et al. |

OTHER PUBLICATIONS

Stanford University website article on Aluminum Gallium Nitride (available online at https://snfguide.stanford.edu /guide/materials/ aluminum-gallium- nitride#:~:text=AlGaN%20is %20an%20alloy% 20material, (High%20Electron%20Mobility %20Transistors as of Mar. 22, 2024 (Year: 2024).*

Kuzmik, J. "InAlN/GaN HEMTs: A First Insight into Technological Optimization" IEEE Trans. on Elec. Dev. vol. 53, No. 3 Mar. 2006 pp. 422-426 (Year: 2006).*

* cited by examiner

GROUP III NITRIDE-BASED TRANSISTOR DEVICE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In some embodiments, a method of fabricating a gate structure for a Group III nitride-based transistor device comprises forming a hard mask on an upper surface of a first Group III nitride barrier layer that is arranged on a Group III nitride channel layer, the first Group III nitride barrier layer and the Group III nitride channel layer having differing bandgaps and forming a heterojunction capable of supporting a two-dimensional charge gas, the hard mask having an opening, removing at least a portion of the first Group III nitride barrier layer exposed in the opening of the hard mask to form a recess having a base and side walls, the recess extending from the upper surface of the first Group III nitride barrier layer into the first Group III nitride barrier layer and forming a p-doped Group III nitride material in the recess, the opening defining the lateral extent of the p-doped Group III nitride material for the gate structure.

In some embodiments, a Group III nitride-based transistor device, comprises a first Group III nitride barrier layer arranged on a Group III nitride channel layer, the first Group III nitride barrier layer and the Group III nitride channel layer having differing bandgaps and forming a heterojunction capable of supporting a two-dimensional charge gas, a source, a gate and a drain on an upper surface of the first Group III nitride barrier layer, a gate recess extending from the upper surface of the first Group III nitride barrier layer into the first Group III nitride barrier layer and a p-doped Group III nitride material arranged in the gate recess and having a first extension extending on the upper surface of the first Group III nitride barrier layer towards the drain. The first extension has a length $l_d$, and 0 nm≤$l_d$≤200 nm.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 1a to 1g illustrate a method for fabricating a gate structure for a Group III nitride-based transistor device.

DETAILED DESCRIPTION

Figure 1A:
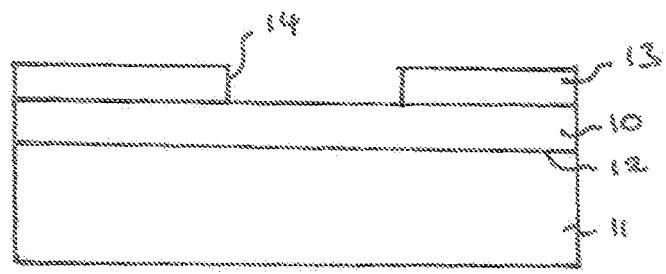

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off. An enhancement-mode device is not limited to low voltages and may also be a high-voltage device.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Aluminum gallium nitride and AlGaN refers to an alloy described by the formula $Al_xGa_{(1-x)}N$, where $0<x<1$.

In some embodiments, a Group III nitride-based transistor device is provided that has a gate structure including a p-doped Group III nitride layer under a metal gate. The p-doped Group III nitride layer is arranged in a gate recess and has an extension in the direction of the drain that is smaller than the extension provided by a T-shape gate in which the T-shape provides a field plate. The extension may be positioned on an upper surface of a Group III nitride barrier layer of the Group III nitride-based transistor device with the gate recess extending into the Group III nitride barrier layer. The length of the extension towards the drain lies within the range of 0 to 200 nm or 10 nm to 100 nm. In some embodiments, the p-doped Group III nitride layer has no extension in the direction of the drain. A typical T-shaped recessed gate structure, which provides a field plate, has an extension with a length of at least 400 nm.

Surprisingly, and contrary to the expected behaviour of a field plate, a shorter extension, or even no extension, in the direction of the drain has been found to reduce gate leakage current, whereas lengths of 400 nm or more have been found to increase the gate leakage current. Without being bound by theory, one explanation for this behaviour is that leakage into the gate is related to a hole current formed at the interface between the Group III nitride barrier and an overlying insulation layer. This hole current is thought to flow into the p-doped Group III nitride gate material. Any potential difference between the channel and the gate structure would appear to enhance gate leakage. Consequently, reducing or eliminating any potential difference between the channel and the gate structure would appear to be beneficial.

In some embodiments, a p-doped Group III nitride layer has an extension extending towards the source has a length which is greater than the length of the extension that extends towards the drain. This arrangement is also the opposite to that commonly used in which the field plate on the drain side of the gate is larger than the field plate on the source side of the gate.

FIGS. 1a to 1g illustrate a method for fabricating a gate structure for a Group III nitride-based transistor device.

FIG. 1a illustrates a Group III nitride barrier layer 10 arranged on a Group III nitride channel layer 11. The Group III nitride barrier layer 10 and the Group III nitride channel layer 11 have differing bandgaps and form a heterojunction 12 capable of supporting a two-dimensional charge gas. The channel layer 11 may be positioned on a substrate which cannot be seen in FIGS. 1a to 1g. The Group III nitride barrier layer 10 may comprise AlGaN and the Group III nitride layer 11 may comprise GaN.

A hard mask 13 is formed on upper surface 26 of the Group III nitride barrier layer 10. The hard mask 13 may include silicon nitride or silicon oxide. The hard mask 13 has an opening 14 such that a portion of the Group III nitride barrier layer 10 is uncovered by the hard mask 13.

Figure 1B:
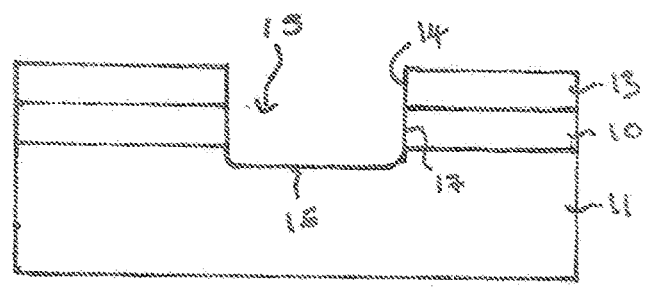

At least a portion of the first Group III nitride barrier layer 10 exposed in the opening 14 of the hard mask 13 is removed to form a recess 15 having a base 16 and sidewalls 17, as is illustrated in FIG. 1b. The recess 15 may be formed by wet chemical etching or plasma etching. The recess 15 may have an elongate strip-like form that extends into the plane of the drawing. The recess 15 may have an elongate trench form. The recess 15 extends from the upper surface 26 of the Group III nitride barrier layer 10 into the Group III nitride barrier layer 10. In some embodiments, the recess 15 has a depth such that the base 16 of the recess 15 is positioned within and formed by the material of the first Group III nitride channel layer 11, as illustrated in FIG. 1b. In other embodiments, such as that illustrated in FIG. 1c, the recess 15 has a smaller depth and has a base 16 that is positioned within and formed by the material of the Group III nitride barrier layer 10.

Figure 1C:
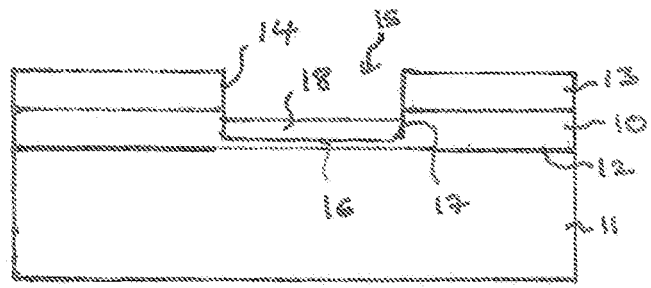
Figure 3:
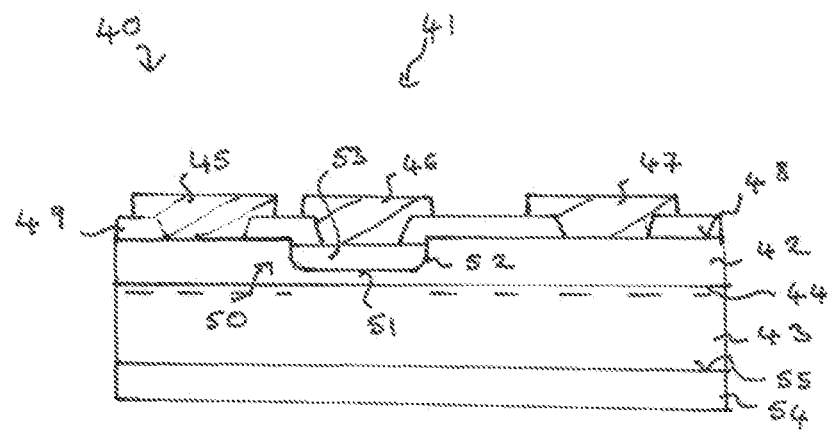
FIG. 3 illustrates a Group III nitride-based transistor device with a gate structure according to an embodiment.

In some embodiments, such as that illustrated in FIG. 1c, a p-doped Group III nitride material 18 is formed in the recess 15, whereby the opening 14 in the hard mask 13 defines the lateral extent of the p-doped Group III nitride material 18. The p-doped Group III nitride material 18 may comprise GaN or AlGaN doped with magnesium. The hard mask 13 is used to define the lateral extent of the recess 15 and the lateral extent of the p doped Group III nitride material 18. Therefore, the method provides a direct alignment of the p-doped Group III nitride material 18 onto the recess 15. This embodiment may be used for a gate recess 15 having a base 16 in the Group III barrier layer 10 such that at least a portion of the barrier layer 10 and the interface between the barrier layer 10 and the channel layer 11 is positioned vertically below the base 16 of the recess 15. A gate metal may then be deposited onto the p-doped Group III nitride material 18 at a position above the recess 15. The structure illustrated in FIG. 1c may be used to form a gate structure in a Group III nitride-based transistor device, as is illustrated in FIG. 3 for example. The hard mask 13 and in particular the opening 14 in the hard mask 13 is used to define and limit the lateral extent of the p-doped Group III nitride material 18 that forms part of the gate structure of the Group III nitride-based transistor device. The p-doped Group III nitride material 18 is formed only in the recess 15 and at the position in which a gate structure is to be formed.

In some embodiments, the p-doped Group III nitride material 18 is selectively formed in the recess 15 using the hard mask 13 as a selective regrowth mask during regrowth and formation of the p-doped Group III nitride material 18. In these embodiments, the barrier layer 10 may be entirely covered by the hard mask 13 so that the opening 14 or openings 14 in the hard mask 13 expose only portions of the barrier layer 10 on which a gate structure is to be formed.

In some non-illustrated embodiments, the p-doped Group III nitride material 18 may entirely fill the recess 15 in the barrier layer 10 such that its upper surface is positioned above the upper surface of the barrier layer 10 and is bounded by the hard mask 13. After removal of the hard mask 13, the p-doped Group III nitride material 18 may protrude from the upper surface of the barrier layer 10. In some embodiments, the recess 15 and the opening 14 in the hard mask 13 are filled with the p-doped material 18. In some embodiments, the p-doped material 18 also extends over the upper surface of the hard mask 13.

Figure 1D:
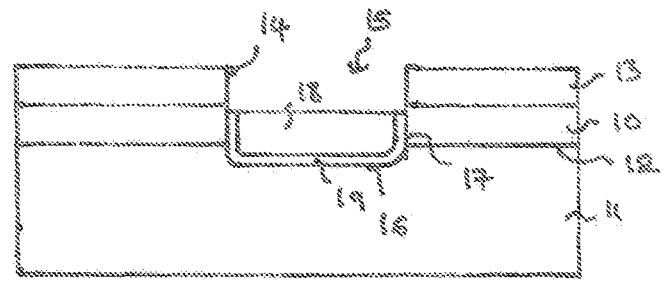
Figure 1A:
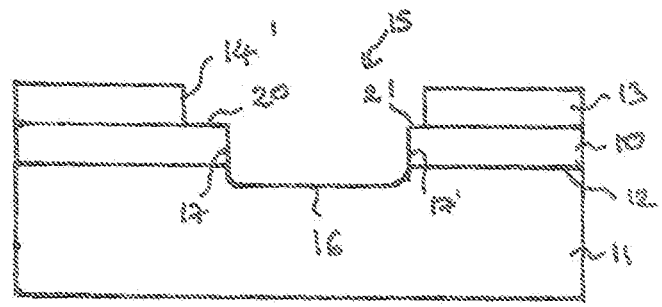

FIG. 1d illustrates an embodiment, in which a second Group III nitride barrier layer 19 is formed on the base 16 and on the sidewalls 17 of the recess 15 and then the p-doped Group III nitride material 18 is formed on the second Group III nitride barrier layer 19 with the hard mask 13 in place on the upper surface 26 of the first Group III nitride barrier layer 10. The hard mask 13 with its opening 14 are used to define the lateral extent of the second Group III nitride barrier layer 19 and the p-doped Group III nitride material 18. Therefore, the method provides a direct alignment of the, second Group III nitride barrier layer 19 and the p-doped Group III nitride material 18 onto the recess 15. A second Group III nitride barrier layer 19 lining the gate recess 15 can be used in embodiments in which the base 16 of the recess is positioned in the channel layer 11.

The p-doped Group III nitride material 18 and the second Group III nitride barrier layer 19 may be selectively formed in the recess 15. A gate metal may be formed on the p-doped Group III nitride material 16 at a position above the recess 15.

In some non-illustrated embodiments, the second Group III nitride barrier layer 19 extends on the sidewalls 17 through the entire thickness of the barrier layer 10. The upper portion of the second Group III nitride barrier layer 19 may be bounded by the hard mask 13. The p-doped material 18 may also have a depth such that its upper surface is positioned substantially coplanar with the interface between the barrier layer 10 and the hard mask 13. In some embodiments, the p-doped material 18 has a depth such that its upper surface is positioned above the interface between the barrier layer 10 and the hard mask 13 so that the p-doped material 18 protrudes above the upper surface of the barrier layer 10 after the removal of the hard mask 13.

In some embodiments, an extension to one or both sides of the p-doped Group III nitride material 18 is formed so that the upper portion of the p-doped Group III nitride material 18 has a larger lateral extent than the base of the p-doped Group III nitride material 18. To form these structures, the method can continue as illustrated in FIG. 1*e* after forming the recess 15 with the structure illustrated in FIG. 1*b*.

After forming the recess 15, which may have a depth such that the base 16 is positioned in either the first Group III nitride barrier layer 10 or in the Group III nitride channel layer 11, a width of the opening 14 in the hard mask 13 is increased, exposing a portion of the first Group III nitride barrier layer 10 that is positioned adjacent at least one sidewall 17 of the recess 15. In the embodiment illustrated in FIG. 1*e*, the width of the opening 14 is increased to form a widened opening 14' such that a first portion 20 and a second portion 21 of the first Group III nitride barrier layer 10 is exposed adjacent opposing sidewalls 17, 17' of the recess 15.

In some embodiments, the widened opening 14' is substantially symmetrically or concentrically arranged with respect to the opening 14 and the recess 15 such that the first portion 20 and the second portion 21 of the first Group III nitride barrier layer 10 that is exposed adjacent opposing sidewalls 17, 17' of the recess 15 substantially the same length. In some embodiments, the length of the first portion 20 and the second portion 21 may differ such that the widened opening 14' is asymmetrically positioned with respect to the recess 15.

Figure 1F:
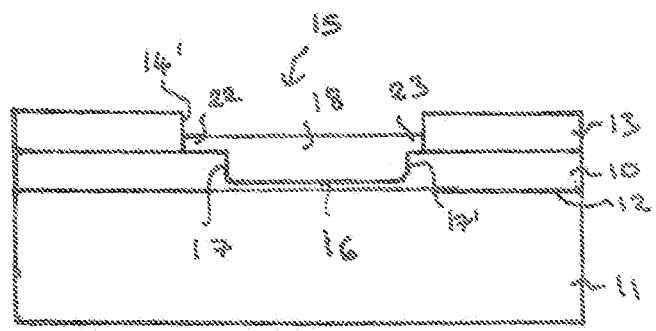

The p-doped Group III nitride material 18 is then formed. In the embodiment illustrated in FIG. 1*f*, the p-doped Group III nitride material 18 fills the recess 15 and has portions positioned on the Group III nitride barrier layer 10 which extend in opposing directions from the side wall 17 of the recess 15 and form extensions 22, 23. The widened opening 14' in the hard mask 13 defines the lateral extent of the p-doped Group III nitride material 18 as illustrated in FIG. 1*f*. The width of the exposed portions 20, 21 corresponds to the desired length of the extension(s) of the subsequently formed gate structure and, in particular, the extensions of the p-doped Group III nitride material 18 which is inserted into the formed in the recess 15 and on the exposed portions 20, 21 of the first Group III nitride barrier layer 10.

Each extension 22, 23 has a strip-like form in plan view for embodiments in which the recess 15 has a strip-like form in plan view. The p-doped Group III nitride material 18 has an upper portion having a greater lateral extent than the lower portion which is bounded by the side walls 17 of the trench 15. A gate metal may then be formed on the p-doped Group III nitride material 18.

Figure 1G:
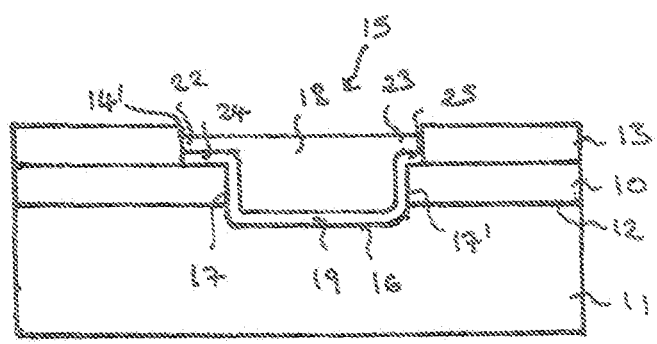

In embodiments including a second Group III barrier layer 19 positioned in the recess 15, as illustrated in FIG. 1*g*, the hard mask 13 with the widened opening 14' is also used to define the lateral extent of the second Group III nitride barrier layer 19. The second Group III nitride barrier layer 19 is formed on the base 16 and sidewall 17 of the recess 15 and onto the exposed portions 20, 21 of the first Group III nitride barrier layer 10. The Group III nitride barrier layer 19 has first and second extensions 24, 25 defined by the widened opening 14'. The p-doped Group III nitride material 18 is formed on the second Group III nitride barrier layer 19 and has a lateral extent which is also defined by the opening 14' such that the p-doped Group III nitride material 18 also has first and second extensions 22, 23 having a length corresponding to the first and second extensions 24, 25 of the second Group III nitride barrier layer 19 which in turn correspond to the lateral extent of the opening 14'. A gate metal may be formed on the p-doped Group III nitride material 18.

The width of the opening 14 may be increased adjacent one side of the recess by a length L such that L is greater than 0 nm and less than 200 nm, or between 10 and 100 nm. In some embodiments, the width of the opening 14 may be increased adjacent only one side of the recess by a length L such that L is greater than 0 nm and less than 200 nm, or between 10 and 100 nm, and such that there is no extension revealing a portion of the Group II nitride barrier layer 10 positioned adjacent the opposing side of the recess 18.

In some embodiments, the width of the opening 14 is increased by a length adjacent two opposing sides of the recess 15, whereby the length $L_1$ on a first side of the recess 15 may be different from the length $L_2$ on a second opposing side of the recess 15. In some embodiments, the opening 14 is increased by a length $L_s$ on a source side of the recess 15 and by length $L_d$ on a drain side the recess, whereby the length $L_s$ is greater than the length $L_d$.

In some embodiments, the method continues by forming a gate metal on the p-doped Group III nitride to form the gate structure for the Group II nitride-based transistor device and by forming a source contact and a drain contact on the first Group III nitride barrier layer 10 on opposing sides of the recess 15 in order to fabricate a Group III nitride transistor device. In some embodiments, the transistor device is a High Electron Mobility Transistor (HEMT) and is an enhancement mode device.

Surprisingly, and contrary to the expected behaviour of a field plate, a shorter extension for example an extension of less than 400 nm, or even no extension, in the direction of the drain has been found to reduce gate leakage current, whereas lengths of 400 nm or more have been found to increase the gate leakage current.

FIGS. 2*a* to 2*e* illustrate a method for fabricating a gate structure for a Group III nitride-based transistor device. This method may be useful for fabricating a gate structure in which the p-doped material 18 includes an extension which is has a greater length, in particular an extension on the source side of the gate which has a greater length.

Figure 2A:
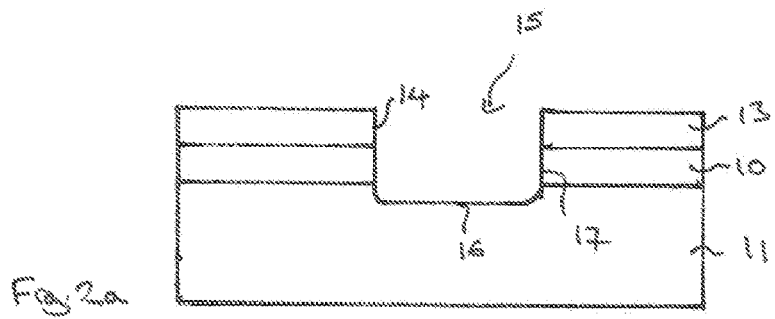
FIGS. 2a to 2e illustrate a method of fabricating a gate structure for a Group III nitride-based transistor device.

FIG. 2a illustrates a first Group III nitride barrier layer 10 arranged on a Group III nitride channel layer 11 and a hard mask 13 arranged on the first major surface 26 of the first Group III nitride barrier layer 10. The hard mask 13 has an opening 14 which is used to define the lateral extent of a recess 15 which extends from the upper surface 26 of the first Group III nitride barrier layer 10 into the first Group III nitride barrier layer 10. In the embodiment illustrated in FIGS. 2a to 2e, the recess 15 has a base 16 which is positioned within the Group III nitride channel layer 11. However, the method may also be used for recess 15 having a smaller depth in which the base 16 of the recess 15 is positioned within the first Group III nitride barrier layer 10.

Figure 2B:
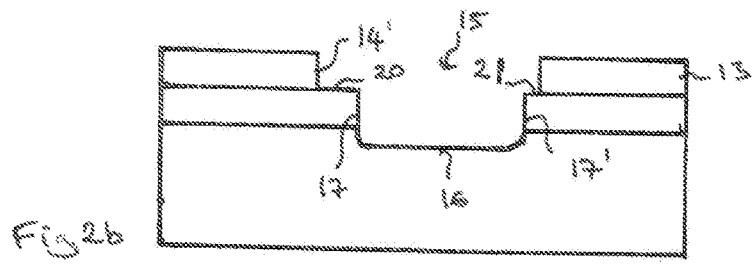

After the formation of the recess 15, the opening 14 of the hard mask 13 may be widened, as illustrated in FIG. 2b, to from a widened opening 14'. The hard mask 13 may be etched at positions adjacent the opening 14 in order to increase the size of the opening 14 to form the widened opening 14'.

In some embodiments, the opening 14 may be widened such that a first portion 20 of the first Group III nitride barrier layer 10 is exposed from the hard mask 13 adjacent a first side 17 of the recess 15. In some embodiments, the opening 14 is widened such that a second portion 21 of the Group III nitride barrier layer 10 positioned adjacent a second opposing side 17' of the recess 15 is uncovered by the widened opening 14'.

In some embodiments, the opening 14 may be widened such that a first portion 20 of the first Group III nitride barrier layer 10 is exposed from the hard mask 13 adjacent a first side 17 of the recess 15 and such that a second portion 21 of the Group III nitride barrier layer 10 positioned adjacent a second opposing side 17' of the recess 15 is uncovered by the widened opening 14'. The length of the first portion 20 and second portion 21 may the substantially the same. The structure illustrated in FIG. 2b may correspond to that illustrated in FIG. 1e.

Figure 2C:
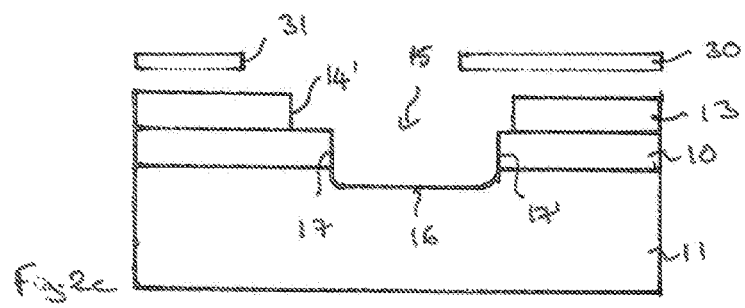

In some embodiments, the formation of the widened opening 14' as is illustrated in FIG. 2b may be omitted and after the formation of the recess 15 as illustrate in FIG. 2a, the method continues by using an additional mask 30 to structure the hard mask 13, as illustrated in FIG. 2c.

Figure 2D:
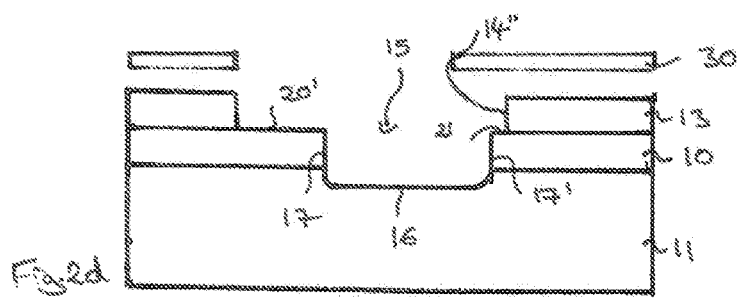

As illustrated in FIG. 2c, the method then continues by using an additional mask 30 to structure the hard mask 13 which may include the opening 14 or the widened opening 14'. The additional mask 30 has an opening 31 that positioned relative to the widened opening 14' in the hard mask 13 so that a portion of the hard mask 13 adjacent the first side wall 17 of the recess 15 is positioned in the opening 31. This portion of the hard mask 13 is removed, for example by etching to further increase the width of the widened opening 14' and to increase the length La of the exposed portion 20' of the upper surface 26 of the Group III nitride layer 10, as is illustrated in FIG. 2d. The opening 31 may be positioned relative to the widened opening 14' such that the second extension 21 and the recess 15 remain substantially the same size. The mask 30 is then removed.

The hard mask 13 with the doubly widened opening 14" is used to define the lateral extent of the p-doped conductive material 18 which is selectively formed in the recess 15 and on the first and second exposed portions 20', 21 of the first Group III nitride barrier layer 10 to form first and second extensions 22, 23. The p-doped conductive material 18 may be selectively formed in the recess 15 and on the first and second exposed portions 20', 21 of the first Group III nitride barrier layer 10.

In some embodiments, for example embodiments in which the opening 14 is not widened before application of the additional mask 30 and formation of the widened opening as defined by the opening 31 in the mask 30, after the removal of the mask 30, this widened opening is further widened. The method illustrated in FIG. 2b can be performed after the method illustrated in FIGS. 2c and 2d is performed.

Figure 2E:
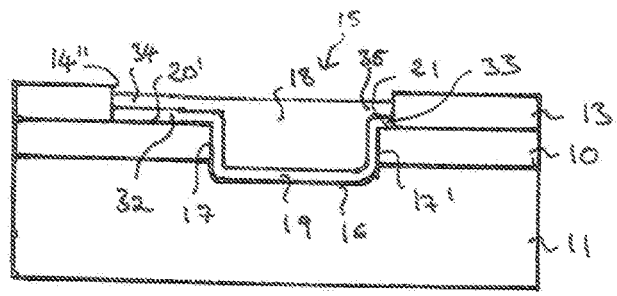

In some embodiments, such as that illustrated in FIG. 2e, a second Group III nitride barrier layer 19 is formed onto the base 16 and sidewalls 17, 17' of the recess 15 and onto the exposed portions 20' and 21 of the first Group III nitride barrier layer 10. The opening 14" in the hard mask 13 defines the lateral extent of the second Group III nitride barrier layer 32 and the extensions 32, 33 of the second Group III nitride barrier layer 19 positioned on the upper surface 26 of the first Group III nitride barrier layer 10.

The p-doped Group III nitride material 18 is then in formed on the second Group III nitride barrier layer 19 such that p-doped Group III nitride material 18 fills the recess 15 and is positioned on the extensions 32, 33 of the second Group III nitride barrier layer 19. The p-doped Group III nitride material 18 has extensions 34, 35 having a lateral extent defined by the opening 14" in the hard mask 13 and therefore having the same lateral extent as the second Group III nitride barrier layer 19.

A gate metal is deposited onto the p-doped Group III nitride material 18. The first extensions 32, 34 have a greater length than the second extensions 33, 35, respectively, and may extend towards the source in the transistor structure. A two-stage process to increase the width of the opening 14 in the hard mask 13, that is used to form the recess 15, may be used to form the opening 14" that is used to define the lateral extent of the first extensions 32, 34. This two-stage process may be useful if the extensions are asymmetrical, i.e. the first extensions 32, 34 adjacent a first sidewall 17 of the recess 15 have a greater length than the second extensions 33, 35 adjacent the opposing side wall 17' of the recess 15. In some embodiments, the two-stage process may be used if the recess has only a single extension, i.e. an extension on the source side of the recess 15.

Group III nitride transistor devices with gate structures, which may be fabricated using the methods disclosed in FIGS. 1a to 1g and FIGS. 2a to 2e, will now be described.

FIG. 3 illustrates a Group III nitride-based transistor device 40 with a gate structure 41 according to an embodiment. The Group III nitride-based transistor device 40 includes a first Group III nitride barrier layer 42 arranged on a Group III nitride channel layer 43. The Group III nitride barrier layer 42 and the Group III nitride channel layer 43 have differing bandgaps and form a heterojunction 44 capable of supporting a two-dimensional charge gas which is indicated schematically in the drawings by a dashed line. The Group III nitride barrier layer 42 may be formed of AlGaN and the Group III nitride channel layer 43 may be formed of GaN. The Group III nitride-based transistor device 40 also includes a source 45, gate 46 and a drain 47 on an upper surface 48 of the Group III nitride barrier layer 42. The source 45, gate 46 and drain 47 may be formed of one or more metals or alloys.

The gate structure 41 of the Group III nitride-based transistor device 40 includes a gate recess 50 which extends from the upper surface 48 of the first Group III nitride barrier layer 42 into the first Group III nitride barrier layer 42. In the embodiment illustrated in FIG. 3, the recess 50 has a depth from the first major surface 48 such that a base 51 of the recess 50 is positioned in and formed by the material of the first Group III nitride barrier layer 42. A p-doped Group III nitride material 53 is arranged in the gate recess 50 and the metal gate 46 is positioned on the p-doped Group III nitride material 53.

The transistor device 40 may also include one or more insulating layers 49 which may act as passivation layers on the upper surface 48 of the barrier layer 42. The insulating layers 49 include openings to allow the source 45 and drain 47 to extend to the Group III nitride barrier layer 42. The insulating layer(s) 49 may include SiN.

The metal gate 46 may be positioned in an opening in the insulating layer(s) 49 and has a lateral extent that is less than the lateral extent of the p-doped Group III nitride material 18 positioned on the upper surface 26. The p-doped Group III nitride material 53 extends between the base 51 of the recess 50 and the gate metal 46.

The p-doped doped Group III nitride material 52 arranged between the metal gate 46 and the first Group III nitride barrier layer 42 produces an enhancement mode device which is normally off. In the embodiment illustrated in FIG. 3, the recess 50 has sidewalls 52 which extend substantially perpendicularly to the first major surface 48. The p-doped doped Group III nitride material 53 is confined within the recess 50 and has an upper surface which is positioned within the recess 50 such that it is spaced at a distance from the upper surface 48. The p-doped Group III nitride material 53 may be GaN or AlGaN doped with magnesium.

The Group III nitride channel layer 43 and the Group III nitride channel layer 42 may be formed on a support substrate 54. The support substrate 54 may include sapphire or silicon, for example. The Group III nitride channel layer 43 and Group III nitride barrier layer 42 may be epitaxially formed on the substrate 54. The support substrate 54 may include a surface 55 which is capable of supporting the epitaxial growth of one or more Group III nitrides, for example the Group III nitride channel layer 43 and Group III nitride channel layer 42. A buffer structure, which is not illustrated in the drawings, may be positioned between an upper surface 55 of the substrate 54 and the Group III nitride channel layer 43.

A typical buffer structure for a silicon substrate includes a AlN starting layer, which may have a thickness of several 100 nm, on the silicon substrate followed by a $Al_xGa_{(1-x)}N$ layer sequence, the thickness again being several 100 nm's for each layer, whereby the Al content of about 50-75% is decreased down to 10-25% before the GaN layer of AlGaN back barrier is grown. Alternatively, a superlattice buffer can be used. Again, an AlN starting layer on the silicon substrate is used. Depending on the chosen superlattice, a sequence of AlN and $Al_xGa_{(1-x)}N$ pairs is grown, where the thickness of the AlN layer and $Al_xGa_{(1-x)}N$ is in the range of 5-15 nm. Depending on the desired breakdown voltage the superlattice may include between 20 and 100 pairs. Alternatively, an $Al_xGa_{(1-x)}N$ layer sequence as described above can be used in combination with the above mentioned superlattice.

Figure 4:
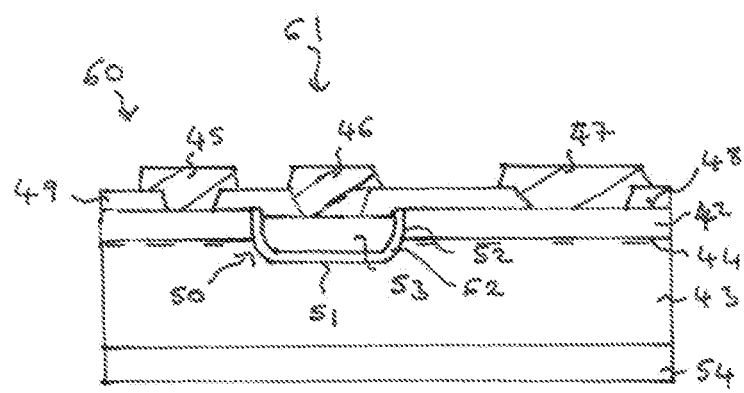
FIG. 4 illustrates a Group III nitride-based transistor with a gate structure according to an embodiment.

FIG. 4 illustrates a Group III nitride-based transistor device 60 including a gate structure 61 according to an embodiment. The Group III nitride-based transistor device 60 includes the substrate 54, Group III nitride channel layer 43 Group III nitride barrier layer 42 arranged on the Group III nitride channel layer 43 and source 45, gate 46 and drain 47 as in the embodiment illustrated in FIG. 3. The gate structure 31 includes a gate recess 50 and a p-doped Group III nitride material 53 arranged in the recess 50 as in the embodiment illustrated in FIG. 3.

The recess 50 of the embodiment illustrated in FIG. 4 has a greater depth such that the base 51 of the recess 50 is positioned within and formed by the Group III channel layer 43. The recess 50 extends through the entire thickness of the Group III barrier layer 42. The gate structure 61 includes a second Group III nitride barrier layer 62 which lines the sidewalls 52 and base 51 of the recess 50. The second Group III nitride barrier layer 62 may be formed of AlGaN and may have the same or a different composition as the first Group III nitride barrier layer 42. The p-doped Group III nitride material 53 is positioned in the recess and is in contact with the second barrier Group III nitride barrier layer 62. The lateral extent of the second Group III nitride barrier layer 62 and the p-doped Group III nitride material 53 is defined by the lateral extent of the recess 50.

In some embodiments, a second barrier layer 62 which lines the recess 50 may be used for a recess having a base positioned within the first Group III nitride barrier layer 42.

Figure 5:
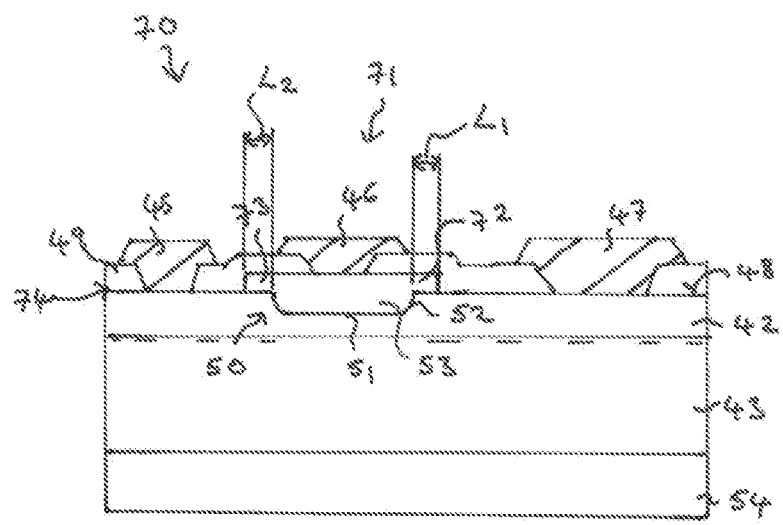
FIG. 5 illustrates a Group III nitride-based transistor with a gate structure according to an embodiment.

FIG. 5 illustrates a Group III nitride-based transistor 70 with a gate structure 71 according to an embodiment. The gate structure 71 includes a recess 50 defined by sidewalls 52 and a base 51. The recess extends from the upper surface 48 of the Group III nitride-based barrier layer 42 and, as in the embodiment illustrated in FIG. 3, the base 51 of the recess 50 is positioned within and defined by the material of the Group III nitride barrier layer 42. The gate structure 51 also includes p-doped Group III nitride material 53 that is positioned in the recess 50.

In the gate structure 71, the p-doped doped Group III nitride material 53 is not only positioned in the recess 50 but also extends over adjoining regions of the upper surface 48 of the Group III nitride barrier layer 42 on one side or on two opposing sides of the recess 50. In particular, the p-doped Group III nitride-based material 53 can be considered to have a first extension 72 having a length $L_1$ and second extension 73 having a length $L_2$ whereby the first extension 72 extends towards the drain 47 and the second extension 73 extends towards the source 45. In some embodiments, the gate structure 71 may include only one extension and this one extension is the second extension 73 which extends towards the source 45.

In some embodiments, the length $L_1$ of the first extension 72 lies within the range of 0 to 200 nm or 10 nm to 100 nm. This length $L_1$ of the first extension 72, which extends in the direction of the drain 47, is shorter than the extension provided by a typical T-shaped recessed gate structure which provides a field plate. Such field plate type extensions have a length of at least 400 nm. However, surprisingly, and contrary to the expected behaviour of a field plate, a shorter first extension 72 in the direction of the drain 47 has been found to reduce gate leakage current, whereas lengths of 400 nm or more have been found to increase the gate leakage current. Without being bound by theory, one explanation for this behaviour is that leakage into the gate is related to a hole current at the interface 74 between the Group III nitride barrier 42 and insulation layer 49 which flows into the p-doped Group III nitride gate material 53.

In some embodiments, the second extension 73, extending towards the source 45 and away from the first extension 72, has a length $L_2$ which is greater than the length $L_1$ of the first extension 72. The length $L_2$ of the second extension 13 may lie in the range of 0 to 1000 nm, or 0 to 500 nm, for example.

Figure 6:
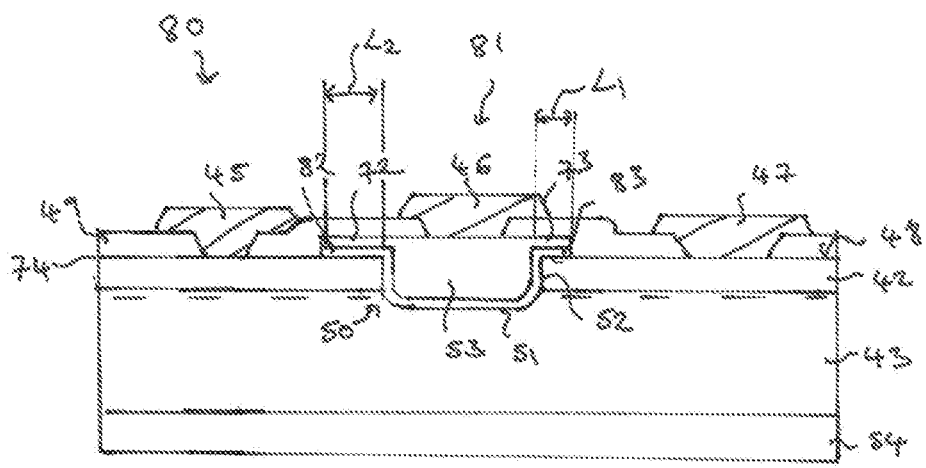
FIG. 6 illustrates a Group III nitride-based transistor with a gate structure according to an embodiment.

FIG. 6 illustrates a Group III nitride-based transistor device 80 which has a gate structure 81 having a recess 50 which extends from the upper surface 48 through the Group III nitride barrier layer 42 such that the base 51 of the recess 50 is positioned within and defined by the Group III nitride channel layer 43, as in the embodiment illustrated in FIG. 4. The Group III nitride-based transistor device 80 also includes a second Group III nitride barrier layer 62 which lines the base and side 51 and sidewalls 52 of the recess 50 as in the embodiment illustrated in FIG. 4.

In the embodiment illustrated in FIG. 6, the gate structure 81 includes a second Group III nitride barrier layer 52, that not only lines the base 51 and sidewalls 52 of the recess 50 but also extends over the upper surface 48 of the first Group III nitride barrier layer 62. The second Group III nitride barrier layer 62 has a first extension 82 which extends towards the drain 47 and a second extension 83 which extends towards the source 45. The first and second extensions 82, 83 of the second Group III nitride barrier layer 62 have the same lateral extent as the first and second extensions 72, 73 of the p-doped Group III nitride material 53.

The p-doped Group III nitride material 53 is arranged on the second Group III nitride barrier layer 62. In the embodiment illustrated in FIG. 6, the p-doped Group III nitride material 53 positioned on the recess 50 also has first and second extensions 72, 73 as in the embodiment illustrated in FIG. 5. The first and second extensions 82, 83 of the second Group III nitride barrier layer 32 may have a length of between 0 and 200 nm or 0 and 100 nm in the case the first extension 82 and between 0 and 1000 nm or 0 and 500 nm for the second extension 83. In some embodiments, the second extension 83 extending towards the source 45 is longer than the first extension 82 extending towards the drain 47.

In some embodiments, the second barrier layer 62 which lines the recess 50 may be used for a recess having a base positioned within the first Group III nitride barrier layer 42.

Figure 7:
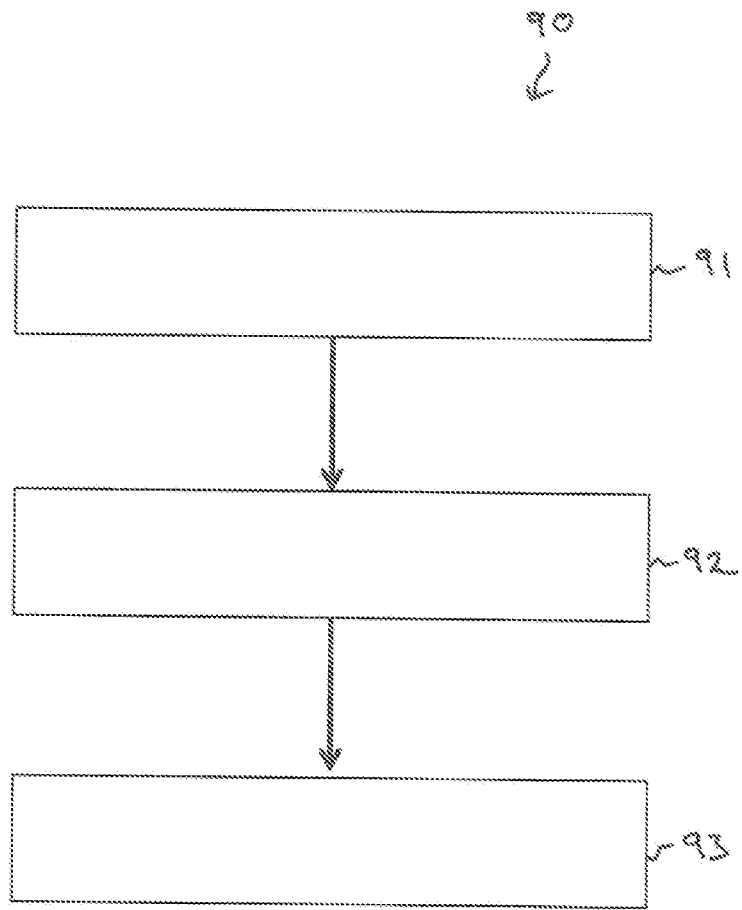
FIG. 7 illustrates a flow chart of a method of fabricating a gate structure for a Group III nitride-based transistor device.

FIG. 7 illustrates a flow chart 90 of a method of fabricating a gate structure for a Group III nitride-based transistor.

In block 91, a hard mask is formed on an upper surface of a first Group III nitride barrier layer that is arranged on a Group III nitride channel layer, the first Group III nitride barrier layer and the Group III nitride channel layer having differing bandgaps and forming a heterojunction capable of supporting a two-dimensional charge gas, the hard mask having an opening. In block 92, at least a portion of the first Group III nitride barrier layer exposed in the opening of the hard mask is removed to form a recess having a base and side walls, the recess extending from the upper surface of the first Group III nitride barrier layer into the first Group III nitride barrier layer. In block 93, a p-doped Group III nitride material is formed in the recess, the opening defining the lateral extent of the p-doped Group III nitride material. In some embodiments, the p-doped Group III nitride material is selectively formed in the recess.

In some embodiments, the p-doped Group III nitride material 18 is selectively formed in the recess 15 using the hard mask 13 as a selective regrowth mask during regrowth and formation of the p-doped Group III nitride material 18. In these embodiments, the barrier layer 10 is entirely covered by the hard mask 13 so that the opening 14 or openings 14 in the hard mask 13 expose only portions of the barrier layer 10 on which a gate structure is to be formed.

Figure 8A:
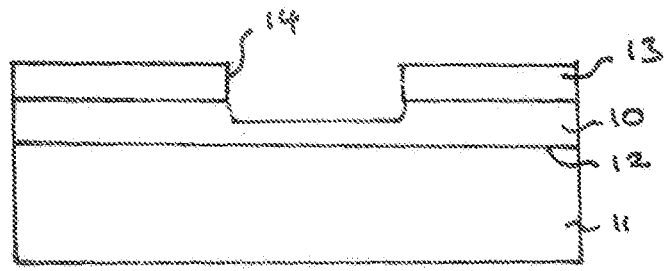
FIGS. 8a to 8d illustrate a method for fabricating a gate structure for a Group III nitride-based transistor device.
Figure 8B:
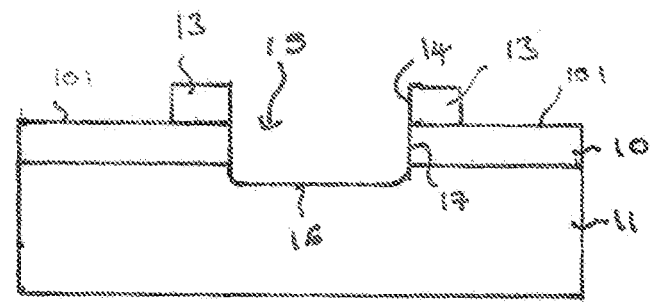

In some embodiments, such as that described with reference to FIGS. 8a to 8d, the hard mask 13 is structured to include an opening 14 that exposes portions of the underlying barrier layer 10 on which a gate structure is to be formed, as illustrated in FIG. 8a. FIG. 8a also illustrates the formation of a recess 15, in the barrier layer 10 and, optionally, the channel layer 11, as described with reference to FIGS. 1a to 1g and FIG. 3. As illustrated in FIG. 8b, after the formation of the recess 15, the hard mask 13 is further structured to remove portions laterally adjacent the recess 15 so as to expose other portions 101 of the barrier layer 10 from the hard mask 13.

These other regions 101 of the barrier layer 13 that are uncovered and exposed from the hard mask 13 may be located between the source electrode and drain electrode of the transistor device and on top of the active region of the transistor device or may be located peripherally outside of the source electrode and drain electrode and in the inactive edge region of the transistor device.

Figure 8C:
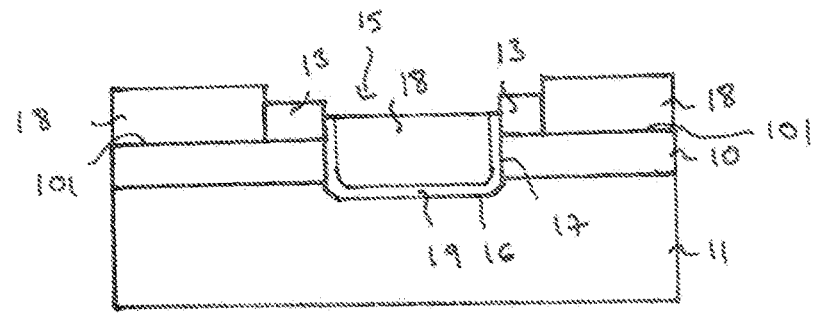

The p-doped layer 18 is formed in the recess 15 and on the planar surface of the barrier layer 10 in the regions 101 adjacent the recess 15 that are uncovered by the hard mask 13, as illustrated in FIG. 8c. If the recess 15 extends into the channel layer 11, a second barrier layer 19 can be formed on the sidewalls 17 and base 16 of the recess 15 before the formation of the p-doped Group III nitride material 18. The recess 15 and the opening 14 in the hard mask 13 defines the lateral extent of the portion of the p-doped Group III nitride material 18 for the gate structure.

Figure 8D:
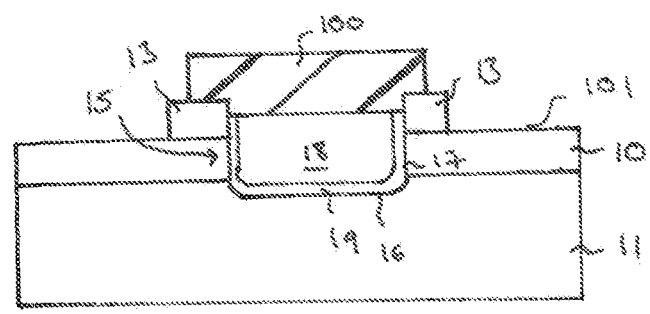

The portion of the p-doped Group III nitride material 18 positioned above the recess 15 is covered by a further mask 100, for example a photo resist. This mask 100 may expose the peripheral edges of the hard mask 13 and exposes the portions of the p-doped Group III nitride material 18 that are positioned on the planar surface of the barrier layer 10 in the regions 101 adjacent the recess 15 and hard mask 13. The exposed portions of the p-doped layer 18 can be removed, as illustrated in FIG. 8d, exposing the regions 101 of the barrier layer 10.

In these embodiments, the hard mask 13 is positioned only at those positions, i.e. immediately laterally adjacent the gate structure, where it is used to define the lateral extent of the p-doped Group material 18 in and immediately adjacent the recess 15 and the lateral extent of the Group III nitride material for the gate structure of the Group III nitride-based transistor device. This method may be used to simplify the formation of the p-doped Group III nitride material 18 and may be used if the p-doped Group III nitride material 18 is formed by a regrowth technique.

FIGS. 9a to 9d illustrate a method in which dummy structures are formed from the p-doped Group III nitride material 18. These dummy structures may be formed in place of or in addition to the recess 15 and the p-doped Group III nitride material for the gate structure. The dummy structures may be formed on regions of the barrier layer 10 that are laterally adjacent and spaced apart from the recess 15.

Figure 9A:
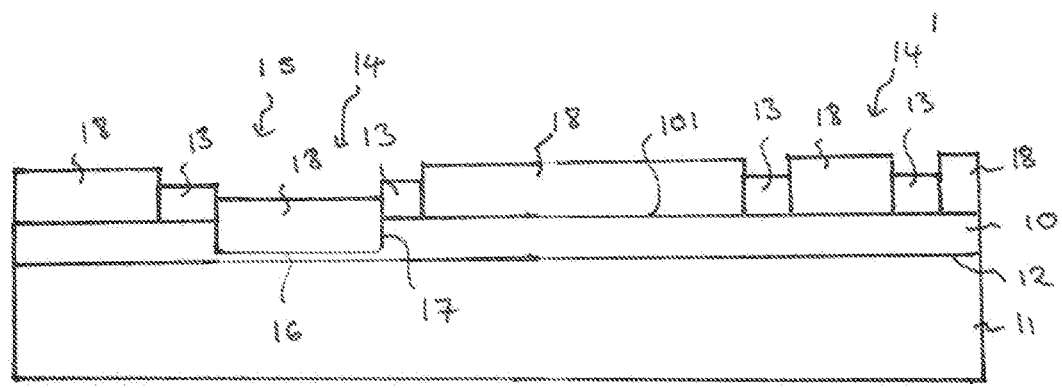
FIGS. 9a to 9d illustrate a method for fabricating structures for a Group III nitride-based transistor device.

FIG. 9a illustrates an embodiment in which the hard mask 13 in formed so as to cover the barrier layer 10 and is structured to include an opening 14 for a gate structure. The hard mask 13 extends over the remainder of the barrier layer 10. The portion of barrier layer 10 and optionally the underlying channel layer 11 that is exposed in the opening 14 is removed to form a recess 15 for a gate structure.

The hard mask 13 is then further structured to define a further opening 14' on the planar surface of the barrier layer 10 that is positioned laterally adjacent and spaced apart from the recess 15. The opening 14' defines the position and lateral extend of a dummy structure. The remainder of the hard mask 13 is removed to uncover regions 101 of the barrier layer 10. The regions of the hard mask 13 defining the openings 14, 14' have a width sufficient to define the opening 14, 14'. The further opening 14' may be positioned between the gate structure and the position of the drain electrode or the source electrode or in the peripheral edge region of the final transistor device. Two or more further openings may also be provided. The p-doped Group III nitride material 18 is then formed in the opening 14 and in the recess 15 for forming the gate structure, in the opening 14' for forming the dummy structure and on the regions 101 uncovered by the barrier layer 10.

Figure 9B:
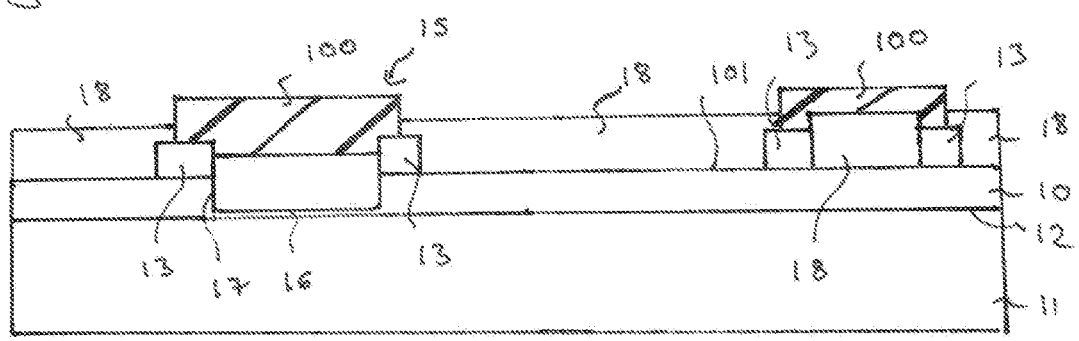
Figure 9C:
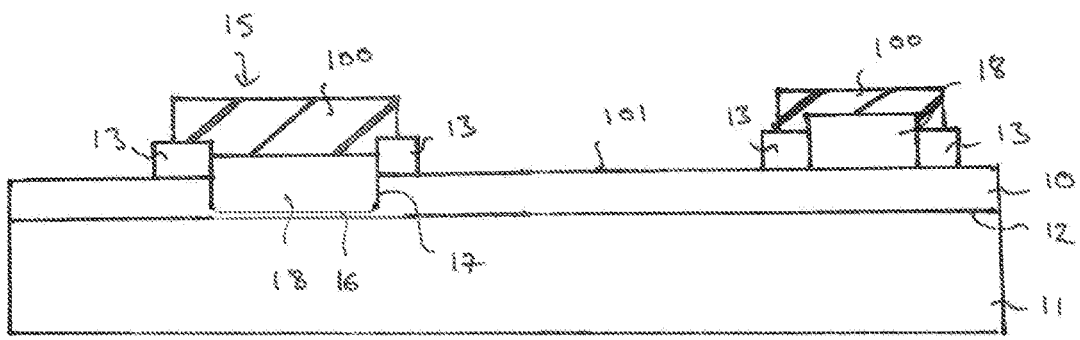
Figure 9D:
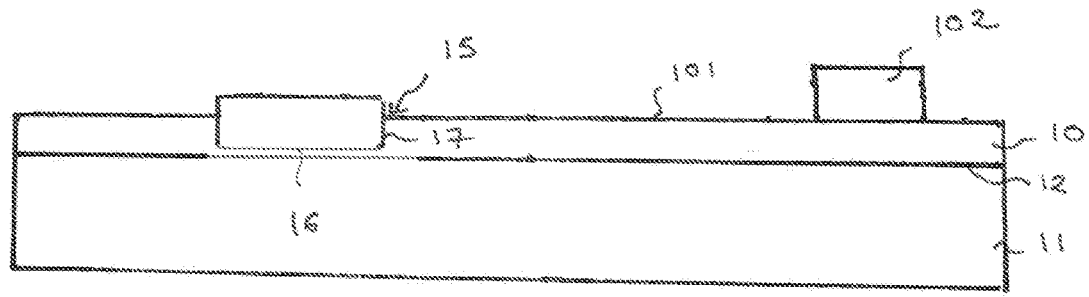

FIG. 9b illustrates that the portions of the p-doped layer 18 that have a lateral extent defined by the openings 14; 14' in the hard mask 13 are covered by portions of a further structured resist layer 100. The further structured resist layer 100 exposes the remainder of the p-doped layer 18. The regions of the p-doped Group III nitride material 18 that are uncovered by the resist layer 100 are then removed, as illustrated in FIG. 9c, and then the resist layer 100 is removed, as illustrated in FIG. 9d. A dummy structure 102 is formed from the p-doped Group III nitride material 18 that is positioned on the planar surface of the barrier layer 10 at a position that is laterally adjacent and spaced apart from the recess 15 and the p-doped Group III nitride material 18 for the gate structure that is positioned within the recess 15 or, in embodiments in which the recess 15 is not formed, from the Group III nitride material 18 for the gate structure. In such a case, when the recess 15 is not formed, the p-doped Group III nitride material 18 for the gate structure is formed similar to the dummy structure 102 on the surface of the barrier layer 10 and may, insofar, be regarded as a p-doped Group III nitride material dummy structure 102 itself.

The lateral extent of the p-doped Group III nitride material 18 for the gate structure and for the dummy structure 102 is defined by the hard mask 13.

In some embodiments, the p-doped Group III nitride material 18 for the gate structure further extends onto the barrier layer 10 in regions immediately adjacent the recess 15, as, for example, in the embodiments illustrated in FIGS. 1g, 2e, 5 and 6. The dummy structure 102 can be positioned on an active portion of the final Group III nitride transistor device, for example between the gate and source or between the gate and drain, or on an inactive portion, for example in the peripheral region of the device. More than one dummy structure may be formed, and one or more dummy structures may be positioned in the active and/or inactive portions of the Group III nitride-based transistor device. The dummy structure may be coupled to the drain as a drain connected field plate-like structure.

In some embodiments, a Group III nitride-based transistor device is provided that has a gate structure including a p-doped Group III nitride layer under a metal gate. The p-doped Group III nitride layer is arranged in a gate recess and has an extension in the direction of the drain that is smaller than the extension provided by a T-shape gate recess in which the T provides a field plate. The length of the extension towards the drain lies within the range of 0 to 200 nm or 10 nm to 100 nm. A typical T-shaped recess gate structure which provides a field plate has an extension with a length of at least 400 nm.

In some embodiments, the p-doped Group III nitride layer has a second extension extending towards the source. The second extension has a length which is greater than the length of the extension that extends towards the drain. This arrangement is the opposite to that commonly used in which the field plate on the drain side of the gate is larger than the field plate on the source side of the gate.

In some embodiments, a second Group III nitride barrier layer is positioned in and lines the base and side walls of the recess. The p-doped Group III nitride material is arranged on the second Group III nitride barrier layer. In some embodiments, this second Group III nitride barrier layer extends onto the upper surface of the first Group III nitride barrier and has one or two extensions. The second Group III nitride barrier layer may have a first extension extending on the upper surface of the first Group III nitride barrier layer towards the drain, the first extension having a length $l_d$, and 0 nm<$l_d$≤200 nm. In some embodiments, the second Group III nitride barrier layer has a second extension extending on the upper surface of the first Group III nitride barrier layer towards the source and the second extension has a length $l_s$, and 0 nm<$l_s$≤500 nm and $l_s$>$l_d$.

Surprisingly, and contrary to the expected behaviour of a field plate, a shorter extension, for example an extension of less than 400 nm, or even no extension, in the direction of the drain has been found to reduce gate leakage current, whereas lengths of 400 nm or more have been found to increase the gate leakage current. Without being bound by theory, one explanation for this behaviour is that leakage into the gate is related to a hole current formed at the interface between the Group III nitride barrier and an overlying insulation layer. This hole current is thought to flow into the p-doped Group III nitride gate material. Any potential difference between the channel and the gate structure would appear to enhance gate leakage. Consequently, reducing or eliminating any potential difference between the channel and the gate structure would appear to be beneficial.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A Group III nitride-based transistor device, comprising:
    a first Group III nitride barrier layer arranged on a Group III nitride channel layer, the first Group III nitride barrier layer and the Group III nitride channel layer having differing bandgaps and forming a heterojunction capable of supporting a two-dimensional charge gas;
    a source, a gate and a drain on an upper surface of the first Group III nitride barrier layer;

a gate recess extending from the upper surface of the first Group III nitride barrier layer into the first Group III nitride barrier layer;

a p-doped Group III nitride material arranged in the gate recess and having a first extension with a length L1 extending on the upper surface of the first Group III nitride barrier layer towards the drain and a second extension with a length L2 extending on the upper surface of the first Group III nitride barrier layer towards the source; and a second Group III nitride barrier layer arranged below the p-doped Group III nitride material on side walls and a base of the gate recess, wherein the second Group III nitride barrier layer has a first extension with a total length Ld of a first lower surface of the second Group III nitride barrier layer extending on the upper surface of the first Group III nitride barrier layer towards the drain and a second extension with a total length Ls of a second lower surface of the second Group III nitride barrier layer extending on the upper surface of the first Group III nitride barrier layer towards the source, wherein the total length Ld of the first extension is between 0 nm and 200 nm and the total length Ls of the second extension is between 0 nm and 500 nm, wherein the total length Ls is greater than the total length Ld, and wherein the length L2 is greater than the length L1.

2. The Group III nitride-based transistor device of claim 1, wherein the length L1 of the first extension is between 0 nm and 200 nm and the length L2 of the second extension is between 0 nm and 500 nm.

3. The Group III nitride-based transistor device of claim 1, wherein the gate recess extends into the Group III nitride channel layer such that the gate recess has a base positioned in the Group III nitride channel layer.

4. The Group III nitride-based transistor device of claim 1, further comprising a gate metal on the p-doped Group III nitride material.

5. The Group III nitride-based transistor device of claim 1, wherein the Group III nitride-based transistor device is a High Electron Mobility Transistor (HEMT) and is an enhancement mode device.

6. The Group III nitride-based transistor device of claim 1, wherein the gate recess has a depth from the upper surface of the first Group III nitride barrier layer such that a base of the recess is positioned in and formed by a material of the first Group III nitride barrier layer.

7. The Group III nitride-based transistor device of claim 1, wherein the length L1 of the first extension is between 10 nm and 100 nm.

8. A Group III nitride-based transistor device, comprising:
a first Group III nitride barrier layer arranged on a Group III nitride channel layer, the first Group III nitride barrier layer and the Group III nitride channel layer having differing bandgaps and forming a heterojunction capable of supporting a two-dimensional charge gas;

a source, a gate and a drain on an upper surface of the first Group III nitride barrier layer;

a gate recess extending from the upper surface of the first Group III nitride barrier layer into the first Group III nitride barrier layer;

a p-doped Group III nitride material arranged in the gate recess; and a second Group III nitride barrier layer arranged below the p-doped Group III nitride material on side walls and a base of the gate recess, wherein the second Group III nitride barrier layer has a first extension with a total length Ld of a first lower surface of the second Group III nitride barrier layer extending on the upper surface of the first Group III nitride barrier layer towards the drain and a second extension with a total length Ls of a second lower surface of the second Group III nitride barrier layer extending on the upper surface of the first Group III nitride barrier layer towards the source, wherein the total length Ld of the first extension is between 0 nm and 200 nm and the total length Ls of the second extension is between 0 nm and 500 nm, wherein the total length Ls is greater than the total length Ld, wherein the p-doped Group III nitride material has a first extension with a length L1 extending on the upper surface of the first Group III nitride barrier layer towards the drain, wherein the p-doped Group III nitride material has a second extension with a length L2 extending on the upper surface of the first Group III nitride barrier layer towards the source, wherein the length L2 is greater than the length L1, wherein the first Group III nitride barrier layer comprises AlGaN and the first Group III nitride barrier layer comprises GaN.

9. The Group III nitride-based transistor device of claim 8, wherein the gate recess extends into the Group III nitride channel layer such that the gate recess has a base positioned in the Group III nitride channel layer.

10. The Group III nitride-based transistor device of claim 8, further comprising a gate metal on the p-doped Group III nitride material.

11. The Group III nitride-based transistor device of claim 8, wherein the Group III nitride-based transistor device is a High Electron Mobility Transistor (HEMT) and is an enhancement mode device.

12. The Group III nitride-based transistor device of claim 8, wherein the length L1 of the first extension of the p-doped Group III nitride material is less than 400 nm.

13. The Group III nitride-based transistor device of claim 8, wherein the gate recess has a depth from the upper surface of the first Group III nitride barrier layer such that a base of the recess is positioned in and formed by a material of the first Group III nitride barrier layer.

* * * * *